(12) United States Patent
Nishitsuka et al.

(10) Patent No.: US 6,748,001 B1
(45) Date of Patent: Jun. 8, 2004

(54) SEMICONDUCTOR LASER DEVICE PROVIDING LASER LIGHT OF TWO WAVELENGTHS AND METHOD OF FABRICATING THE SAME

(75) Inventors: Mitsuru Nishitsuka, Tsurugasima (JP);
Hiroyuki Ota, Tsurugashima (JP);
Kiyofumi Chikuma, Tsurugashima (JP)

(73) Assignee: Pioneer Corporation, Tokyo (JP)

( * ) Notice: Subject to any disclaimer, the term of this patent is extended or adjusted under 35 U.S.C. 154(b) by 0 days.

(21) Appl. No.: 09/516,731

(22) Filed: Mar. 1, 2000

(30) Foreign Application Priority Data

Mar. 3, 1999 (JP) ............................. 11-056101

(51) Int. Cl.[7] ............................. H01S 5/00; H01S 3/10; H01S 3/00; H01S 3/14; H01S 3/047
(52) U.S. Cl. .......................... 372/43; 372/23; 372/38.1; 372/44; 372/50; 372/68; 372/81
(58) Field of Search .......................... 372/43, 44, 23, 372/38.1, 68, 81

(56) References Cited

U.S. PATENT DOCUMENTS

| | | | | | |
|---|---|---|---|---|---|
| 4,152,711 A | * | 5/1979 | Nakata | ...................... | 357/17 |
| 5,699,218 A | * | 12/1997 | Kadah | ...................... | 361/13 |
| 6,058,124 A | * | 5/2000 | Sun et al. | ...................... | 372/46 |
| 6,136,623 A | * | 10/2000 | Hofstetter et al. | ............ | 438/28 |
| 6,233,265 B1 | * | 5/2001 | Bour et al. | ................... | 372/45 |
| 6,400,742 B1 | * | 6/2002 | Hatakoshi et al. | ............ | 372/46 |

* cited by examiner

*Primary Examiner*—Paul Ip
*Assistant Examiner*—Armando Rodriguez
(74) *Attorney, Agent, or Firm*—Morgan, Lewis & Bockius LLP

(57) ABSTRACT

An object of the present invention is to provide a semiconductor laser device which is capable of selectively emitting two kinds of laser light of light emitting characteristics differing in wavelength, light emission point, beam shape, light emission power, longitudinal mode and so on, by switching the direction of the voltage applied to the device. There is provided the semiconductor laser device including first and second laser units, each unit having a ridge type structure and each unit comprising a multilayer structure body made of at least an n-type semiconductor layer, an active layer and a p-type semiconductor layer deposited in this order, and a p-side electrode and an n-side electrode, wherein the p-side electrode and the n-side electrode of the first laser unit and the n-side electrode and the p-side electrode of the second laser unit are electrically connected, respectively.

9 Claims, 6 Drawing Sheets

SEMICONDUCTOR LASER DEVICE PROVIDING LASER LIGHT OF TWO WAVELENGTHS AND METHOD OF FABRICATING THE SAME

BACKGROUND OF THE INVENTION

1. Field of the Invention

The present invention relates to a semiconductor laser device capable of selectively emitting two kinds of laser light different from each other in wavelength, emission point, beam shape, emission power, longitudinal mode and so on, by switching the direction in which a voltage is applied to the device.

2. Description of the Background Art

A semiconductor laser device is widely employed in optical information recording apparatus such as a CD player, a DVD player and so on. In particular, the semiconductor laser device employed in the optical pick-up is differently manufactured depending on the requested information recording density or the like of the optical information recording apparatus. For example, an infrared semiconductor laser device of a wavelength of 780 nm is employed for a CD player, a red semiconductor laser device of a wavelength of 650 nm is employed for a DVD player, and a blue semiconductor laser device of a wavelength of 410 nm is employed for an improved type DVD player, or a HD-DVD player in which information recording capacity per unit area is increased.

As shown in FIG. 1, a conventional ridge type semiconductor laser device employed in an optical pick-up is formed of a multilayer structure body in which, for example, a substrate 101 has an n-type semiconductor layer 102, n-type semiconductor cladding layer 103, an active layer 104, a p-type semiconductor cladding layer 105, a p-type semiconductor contact layer 106 deposited thereon in this order. Then, a p-type electrode 107 and an n-type electrode 108 are formed on the p-type semiconductor contact layer 106 and the n-type semiconductor layer 102, respectively.

According to the semiconductor laser device of the structure, if the material of each layer, the thickness of the same and so on are properly selected, it becomes possible to vary the light emission characteristic of the oscillated laser wavelength or the like. For example, if an AlGaAs system material is selected for the semiconductor layers, the laser device will oscillate at a wavelength of an infrared range near 780 nm, if an AlGaInP system material is selected for the same, then the device will oscillate at a wavelength near 650 nm, and if a GaN system material is selected for the device, the device will oscillate at a wavelength of near 400 nm.

The above-described semiconductor laser device oscillates only at a predetermined single wavelength. Thus, a compatible player, which is designed for reproducing both of the CD and DVD employs a reproducing mechanism described as follows. That is, 1) the compatible player is equipped with a plurality of pickups each having a semiconductor laser device designed to cope with each kind of optical disk, whereby reproduction operation is carried out, 2) a plurality of semiconductor laser devices each having different wavelength are arrayed within a single optical pick-up package and a laser device is selectively energized for light emission for each optical disk, thus carrying out the reproducing operation.

However, according to the scheme of 1), it is necessary to provide a drive mechanism for each pick-up, with the result that the apparatus becomes large and manufacturing cost is increased. According to the scheme of 2), light emitted from a plurality of laser devices shall be optically coupled to a single lens of the pick-up. Therefore, the emission spots of the laser devices should be sufficiently close to each other, whereby the manufacturing process includes a very cumbersome step of positioning each laser device with high accuracy on a substrate, which fact also causes cost increase.

SUMMARY OF THE INVENTION

As has been described above, it is desired to provide a semiconductor laser device capable of emitting laser light of a plurality of wavelengths by use of a single semiconductor device without a plurality of semiconductor devices each emitting laser light of a single wavelength are arrayed.

Further, it is desired to provide a semiconductor laser device having a single device arrangement which is capable of emitting various laser light differing in not only wavelength but also light emitting point, beam shape, emission power, longitudinal mode and so on.

Therefore, it is an object of the present invention to provide a semiconductor laser device capable of emitting laser light of a couple of different light emitting characteristics as described above. Also, it is an object of the present invention to propose a fabricating method thereof.

According to the present invention, there is provided a semiconductor laser device including first and second laser units, each having a ridge type structure and each comprising a multilayer structure body made up of at least an n-type semiconductor layer, an active layer and a p-type semiconductor layer deposited in this order, and a p-side electrode and an n-side electrode, wherein the p-side electrode and the n-side electrode of the first laser unit and the n-side electrode and the p-side electrode of the second laser unit are electrically connected, respectively.

Further, according to the present invention, there is proposed a method of fabricating a semiconductor laser device including a laser assembly forming step composed of a step for forming a multilayer structure body having at least an n-type semiconductor layer, an active layer and a p-type semiconductor layer deposited on a substrate, a step for partly removing a top portion of the multilayer structure body so as to expose the n-type semiconductor layer, thus forming a ridge in a stripe fashion, and a step for forming a first electrode on the top portion of the ridge and a second electrode on the n-type semiconductor layer at a position lower than the top of the ridge, a step for preparing first and second laser assemblies by repeating the laser assembly forming step, a step for bringing the first laser assembly and the second laser assembly into registration with each other so that the first electrode and the second electrode of the first laser assembly are brought to opposition to the second electrode and the first electrode of the second laser assembly with a fusing material interposed therebetween, a step for intimately attaching the first and second laser assemblies with each other and melting the fusing material to bond the first and second laser assemblies together, a step for removing at least the substrate of insulating property from the first and second laser assemblies, and a step for forming an electrode on the bottom of the n-type semiconductor layer of the first and second laser assemblies.

DESCRIPTION OF THE PREFERRED EMBODIMENT

Figure 1:
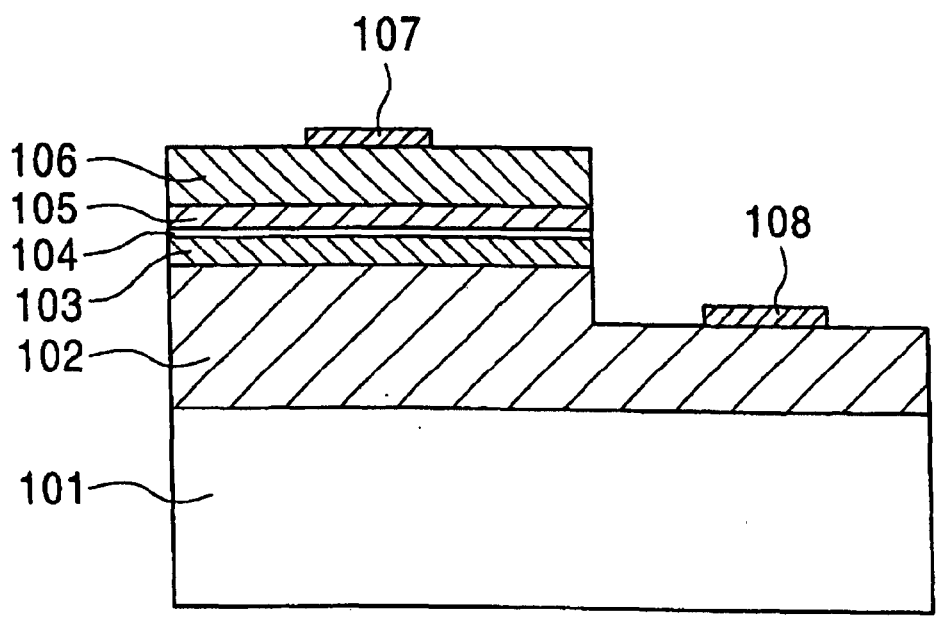
FIG. 1 is a cross-sectional view showing an example of a structure of a conventional semiconductor laser device.
Figure 2:
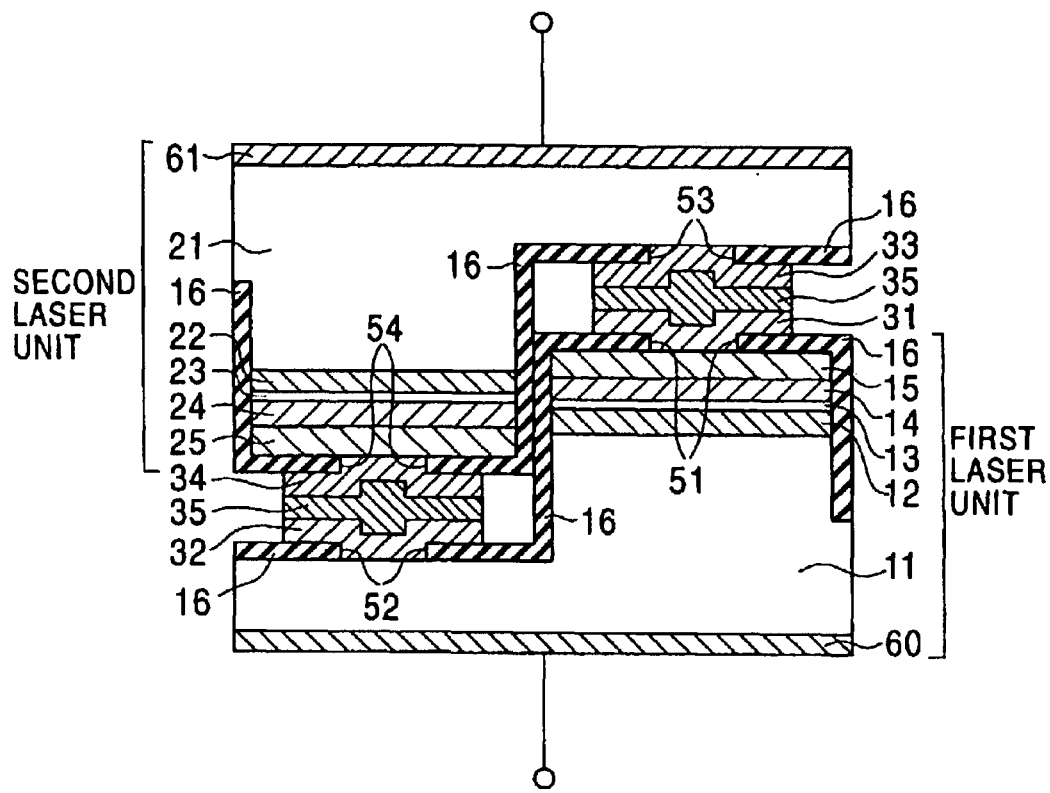
FIG. 2 is a cross-sectional view showing a structure of a semiconductor laser device according to the present invention.

As shown in FIG. 2, the semiconductor laser device according to the present invention is formed of a first laser unit and a second laser unit.

The first laser unit is a gallium nitride (GaN) system laser having a ridge structure. The first laser unit is formed of a multilayer structure body in which an n-type AlGaN cladding layer 12, an active layer 13, a p-type AlGaN cladding layer 14 and a p-type GaN contact layer 15 are deposited in this order on an n-type GaN layer 11. The contact layer 15 corresponding to the top portion of the ridge and the lower portion of the n-type GaN layer 11 at a position lower than the top of the ridge have windows 51, 52 formed, respectively. The contact layer 15 and the n-type GaN layer 11 are covered with an insulating layer 16 made of silica (SiO2) or the like at portions other than the windows 51, 52. Further, the contact layer 15 is connected with a nickel (Ni) electrode layer 31 through the window 51 while the n-type GaN layer 11 is connected with a titanium-gold (Ti/Au) electrode layer 32 through the window 52.

The second laser unit is an aluminum-gallium-arsenide (AlGaAs) system laser having a ridge structure. The second laser unit is formed of a multilayer structure body in which an n-type AlGaAs cladding layer 22, an active layer 23, a p-type AlGaAs cladding layer 24 and a p-type GaAs contact layer 25 are deposited in this order on an n-type GaAs substrate 21. The lower portion of the n-type GaAs substrate 21 at a position lower than the top of the ridge and the p-type GaAs contact layer 25 corresponding to the top portion of the ridge have windows 53, 54 formed, respectively. The n-type GaAs substrate 21 and the p-type GaAs contact layer 25 are covered with the insulating layer 16 made of SiO2 or the like at portions other than the windows 53, 54. Further, the n-type GaAs substrate 21 is connected with a gold-germanium (Au—Ge) alloy electrode layer 33 through the window 53 while the p-type GaAs contact layer 25 is connected with a chromium (Cr) electrode layer 34 through the window 54.

The p-side electrode and the n-side electrode of the first laser unit are electrically connected to the n-side electrode and the p-side electrode of the second laser unit. It is preferable to interpose a connecting layer between each couple of connected electrodes for maintaining mechanical strength of the device. The Ni electrode layer 31 of the first laser unit and the Au—Ge alloy electrode layer 33 of the second laser unit are connected to each other through a gold-tin (Au—Sn) alloy layer 35. Also, the Ti/Au electrode layer 32 of the first laser unit and the Cr electrode layer 34 of the second laser unit are connected to each other through the Au—Sn alloy layer 35.

The first laser unit is provided with a Ti/Au electrode 60 on the face of the n-type GaN layer 11 opposite to the face on which the insulating layer 16 is disposed. This electrode 60 may be made of titanium-aluminum (Ti/Al). Similarly, the second laser unit is provided with an Au—Ge electrode 61 on the face of the n-type GaAs substrate 21 opposite to the face on which the insulating layer 16 is disposed.

Figure 3:
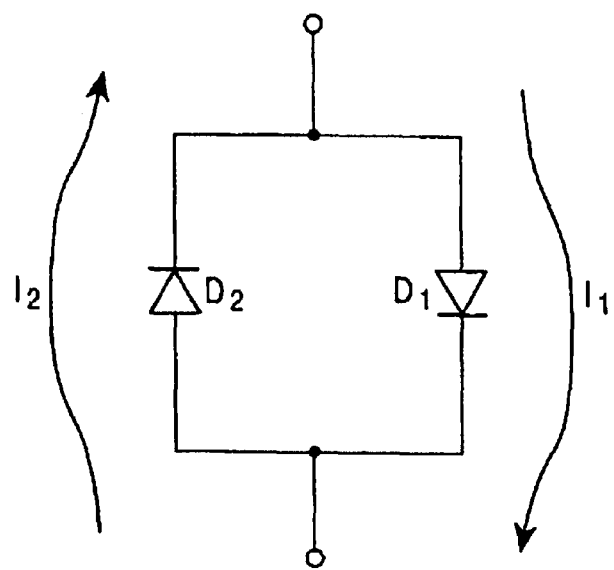
FIG. 3 is a diagram showing an equivalent circuit of the semiconductor laser device of FIG. 2.

According to the arrangement described above, the first laser unit and the second laser unit form a diode $D_1$ and a diode $D_2$, respectively, as shown in the equivalent circuit of FIG. 3. The two diodes form a circuit in which the diodes are coupled to each other with polarities of the diodes inverse to each other. Accordingly, when current flows in the direction of $I_1$, then the first laser unit emits light while when current flows in the direction of $I_2$, then the second laser unit emits light.

Figure 4:
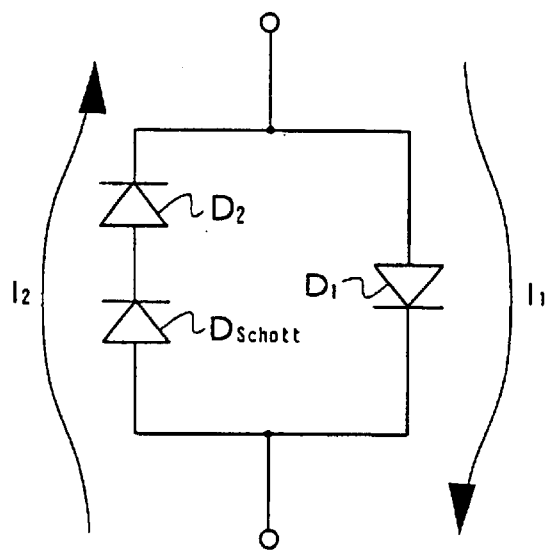
FIG. 4 is a diagram showing an equivalent circuit of another semiconductor laser device according to the present invention.

As shown in FIG. 4, the semiconductor laser device may be arranged such that a Schottky barrier made of a semiconductor-metal junction is provided between the first laser unit and the second laser unit, e.g., on the connecting layer, so that the Schottky barrier is directed in the same direction as the laser operating direction. That is, the arrangement includes the Schottky diode $D_{schott}$ requiring a small voltage applied in the forward direction as compared with a pn diode. This arrangement is preferable because the reverse withstand voltage of the semiconductor laser $D_1$ can be compensated when operating the semiconductor laser $D_2$. The Schottky diode may be formed on either one or both of the two connecting layers connecting the first and second laser units.

Figure 5:
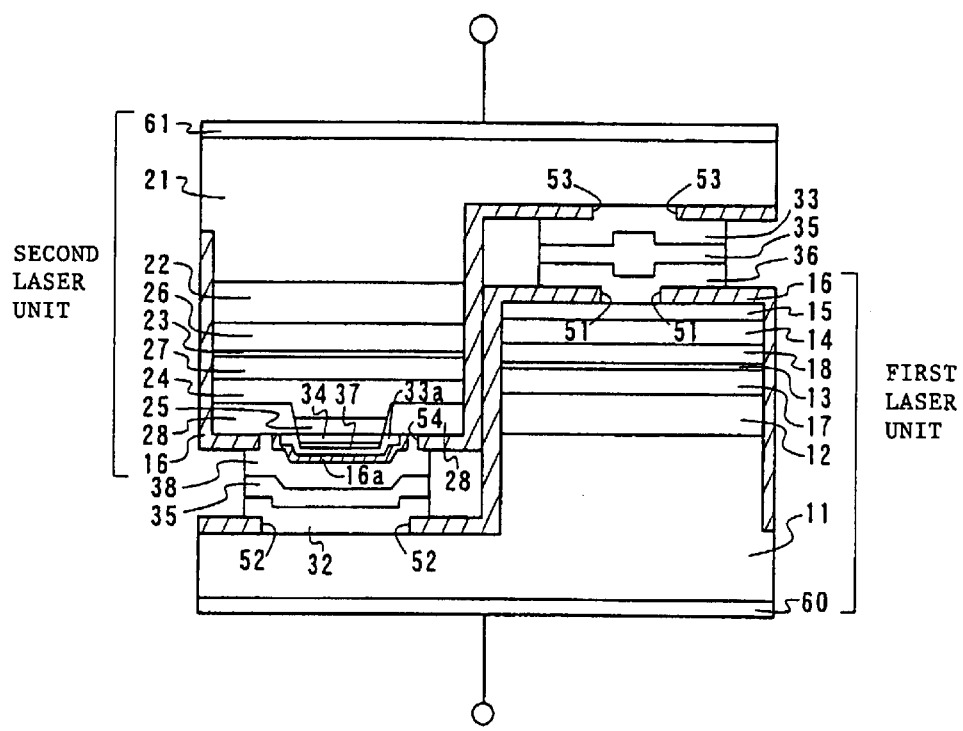
FIG. 5 is a cross-sectional view showing a structure of a semiconductor laser device according to the present invention.

FIG. 5 shows another example of the semiconductor laser device according to the present invention. As shown in FIG. 5, the semiconductor laser device has a Schottky diode formed in the semiconductor laser unit.

The first laser unit is a gallium nitride (GaN) system laser having a ridge structure. The first laser unit is formed of a multilayer structure body in which the n-type AlGaN cladding layer 12, an n-type AlGaN guiding layer 17, the active layer 13, a p-type AlGaN guiding layer 18, the p-type AlGaN cladding layer 14 and the p-type GaN contact layer 15 are deposited in this order on the n-type GaN layer 11. The contact layer 15 corresponding to the top portion of the ridge and the n-type GaN layer 11 corresponding to the lower portion have the windows 51, 52 formed, respectively. The contact layer 15 and the n-type GaN layer 11 are covered with the insulating layer 16 made of silica (SiO2) or the like at portions other than the windows 51, 52. Further, the contact layer 15 is connected with a nickel-gold (Ni/Au) electrode layer 36 through the window 51 while the n-type GaN layer 11 is connected with the titanium-gold (Ti/Au) electrode layer 32 through the window 52.

The second laser unit is an aluminum-gallium-arsenide (AlGaAs) system laser having a ridge structure. The second laser unit is formed of a multilayer structure body in which the n-type AlGaAs cladding layer 22, an n-type AlGaAs guiding layer 26, the active layer 23, a p-type AlGaAs guiding layer 27, the p-type AlGaAs cladding layer 24 and the p-type GaAs contact layer 25 are deposited in this order on the n-type GaAs substrate 21. The p-type GaAs contact layer 25 is doped with a p-type impurity at a concentration of about $10^{19}$ to $10^{20}$ 1/cc. The contact layer 25 forms a ridge stripe extending parallel to the direction of the laser resonator forming direction (the normal direction of the face of FIG. 5). The ridge stripe has at both the sides thereof n-type AlGaAs current confining layers 28. The ridge stripe may partly contain a p-type AlGaAs cladding layer 24. Further, the top surface of the multilayer structure body is covered with the insulating layer 16. The n-type GaAs substrate corresponding to the lower portion may have a window 53 formed. Also, a window 54 may be formed on a part of the p-type GaAs contact layer 25 and the n-type AlGaAs current confining layer 28 corresponding to the top portion of the ridge.

The Au—Ge alloy electrode layer 33 is provided on the n-type GaAs substrate 21 through the window 53. The Cr electrode layer 34 and a Pt intermediate layer 37 are provided on the p-type GaAs contact layer 25. Furthermore, an Au—Ge alloy layer 33a is provided so as to encapsulate the Cr electrode layer 34 and the Pt intermediate layer 37 on the current confining layer 28. The AuGe alloy layer 33a is covered with the insulating layer 16a so that the alloy layer 33a is encapsulated on the current confining layer 28. A Pd electrode layer 38 is formed so that a part thereof is contacted to the current confining layer 28 and that the electrode layer 38 covers the insulating layer 16a to fill the window 54.

The Ni/Au electrode layer 36 of the first laser unit and the Au—Ge alloy layer 33 of the second laser unit are connected through the Au—Sn alloy layer 35. Further, the Ti/Au electrode layer 32 of the first laser unit and the Pd electrode layer 38 of the second laser unit are connected through the Au-Sn alloy layer 35.

The first laser unit is provided with the electrode 60 made of Ti/Al or Ti/Au on the face of the n-type GaN layer 11 opposite to the face on which the insulating layer 16 is provided. Similarly, the second laser unit is provided with the AuGe electrode 61 on the face of the n-type GaAs substrate 21 opposite to the face on which the insulating layer 16 is provided.

Figure 6:
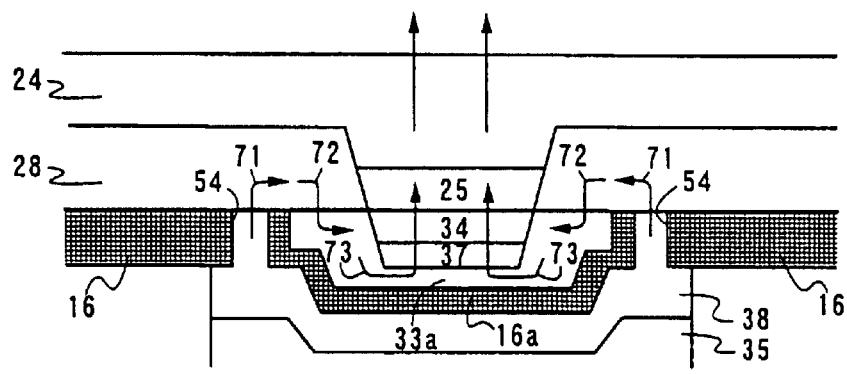
FIG. 6 is an enlarged cross-sectional view showing a structure of the connecting portion of first and second laser units of the semiconductor laser device of FIG. 5.

According to the above arrangement, as is illustrative in the equivalent circuit shown in FIG. 4, the reverse withstand voltage of the second laser unit forming the diode $D_2$ can be compensated by the diode $D_{schott}$. FIG. 6 illustrates a manner of current flow when a voltage is applied to the laser device to make the current flow in the direction of an arrow $I_2$ in FIG. 4. The current flows through the Au—Sn metal alloy layer 35 and the Pd electrode layer 38 to the current confining layer 28. In this case, the Pd electrode layer 38 forms a Schottky diode $D_{schott}$ together with the n-type AlGaAs current confining layer 28. The Schottky diode $D_{schott}$ is forward-biased and hence the current flows in the direction of an arrow 71. The Au—Ge layer 33a and the n-type AlGaAs current confining layer 28 are contacted to each other in an ohmic fashion. Thus, the current is led in the direction of an arrow 72. Further, as described above, the p-type GaAs contact layer is heavily doped with a p-type impurity and hence the layer maintains a metallic property. Therefore, the Cr electrode layer 34 and the p-type GaAs contact layer 25 are contacted to each other in an ohmic fashion. The current flows in the direction of an arrow 73. Thus, the current flows in the second laser unit as described above.

On the other hand, when a voltage is applied to the device with the polarity that corresponds to a current flow in the direction of arrow $I_1$, the current flows in the first laser unit. That is the Schottky diode composed of the Pd electrode layer 38 and the n-type AlGaAs current confining layer 28 is reverse-biased. Thus, the current is prevented from flowing through the second laser unit. According to the above arrangement, the second laser unit can be protected from the reverse voltage load that might exceed the proof reverse withstand voltage of the second laser unit of GaAs system, such as the operating voltage of 3 (theoretical threshold value) to 6V necessary for the first laser unit of GaN system. The above-described structure having a Schottky diode formed therein may be employed in the first laser unit.

Although the above-described semiconductor device of the present invention has a combination of the GaN system laser and GaAs system laser for the first and second laser units, the combination is not limited to the above-described one. The combination may be any couple selected from, for example, AlInGaP system laser, GaAs system laser, GaN system laser, InP system laser and so on. Further, the couple may be composed of the lasers of same material system. In this case, if the direction in which the voltage is applied is changed, the emitting point of laser can be preferably changed by changing the polarity of the applied voltage to the device. That is, if the combination of the laser devices, each having different material and characteristic, is appropriately selected, it becomes possible to obtain various kinds of laser light differing in wavelength, light emission point, beam shape, emission power, longitudinal mode and so on, depending on the voltage applied to the laser device.

A method for fabricating the nitride semiconductor laser device will hereinafter be described in detail.

Figure 7:
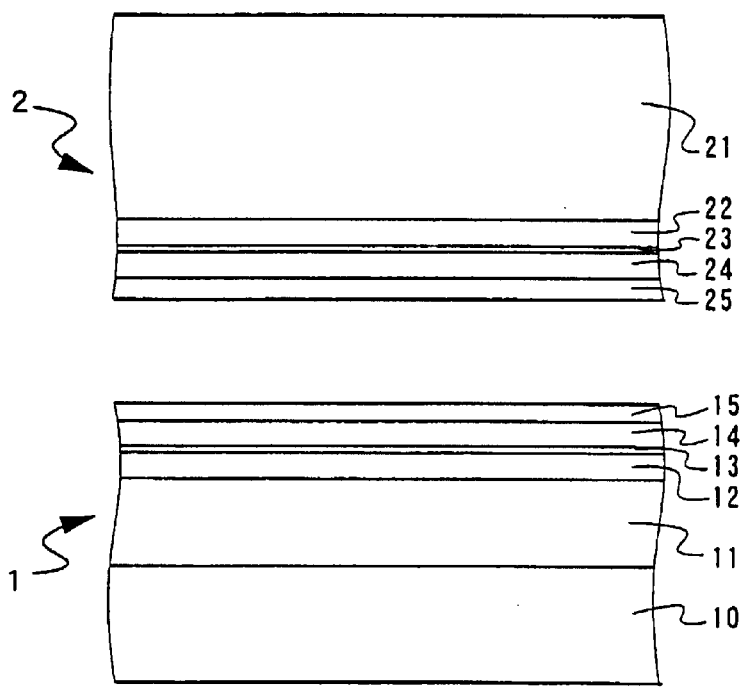
FIG. 7 is a cross-sectional view of first and second multilayer structures before ridges are formed.

As shown in FIG. 7, the first multilayer structure body 1 and the second multilayer structure body 2 constituting the first and second laser units are independently fabricated by metal-organic chemical vapor deposition (MOCVD method).

The first multilayer structure body is fabricated in such a manner that a sapphire substrate 10 is placed in a MOCVD reactor, precursor gases are introduced into the reactor, and the n-type GaN layer 11, the n-type AlGaN cladding layer 12, the active layer 13, the p-type AlGaN cladding layer 14 and the p-type GaN contact layer 15 are deposited in this order.

On the other hand, the second multilayer structure body 2 can be obtained in such a manner that the n-type AlGaAs cladding layer 22, the active layer 23, the p-type AlGaAs cladding layer 24 and the p-type GaAs contact layer 25 are deposited in this order on the n-type GaAs substrate 21.

Figure 8:
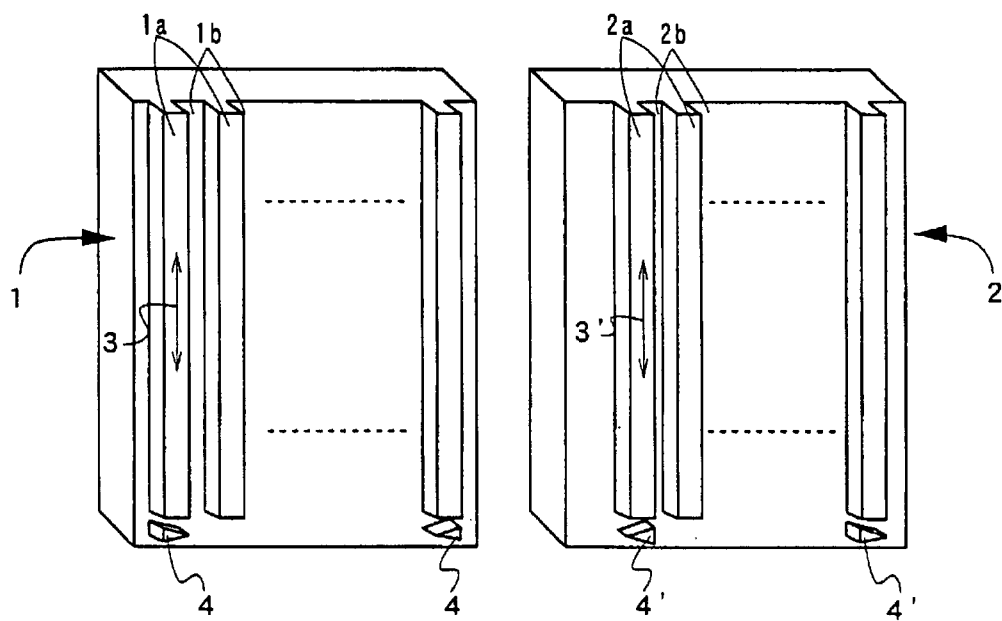
FIG. 8 is a perspective view of the first and second multilayer structures after the ridges are formed.
Figure 9:
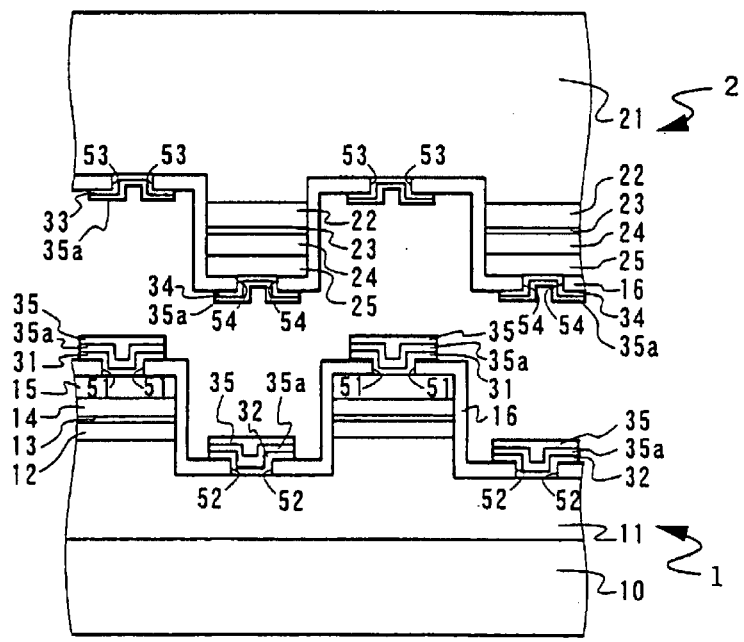
FIG. 9 is a cross-sectional view of the first and second multilayer structures after electrodes are formed.

As shown in FIGS. 8 and 9, the film forming surfaces of the first and second multilayer structure bodies 1, 2 are applied with masking of a stripe fashion. The first multilayer structure body 1 is subjected to an RIE (reactive ion etching) to form a ridge thereon while the second multilayer structure body 2 is subjected to a chemical etching to form a ridge thereon. Then, portions of the structure body not covered with the mask undergoes etching. Finally, the mask is removed and the ridge formation is completed. In this case, the longitudinal direction of the ridge, or the direction indicated by arrows 3 and 3' is the direction in which the laser resonator is formed. Therefore, the ridge is formed on the first multilayer structure body 1 such that the direction of the arrow 3 is the direction of <1 –1 0 0>or <1 1 –2 0> of the crystal of the n-type GaN layer 11 while the ridge formed on the second multilayer structure body 2 is formed such that the direction of the arrow 3' is the direction of <1 1 0> of the GaAs crystal.

As will be described below, the ridges of the first and second multilayer structure bodies 1, 2 are formed in such a manner that they have the same height, the width of the ridge of the first structure body 1 is equal to the interval of the ridge of the second multilayer structure body 2, and that the width of the ridge of the second structure body 2 is equal to the interval of the ridge of the first multilayer structure body 1. According to the sizing of the ridges, when the first and second multilayer structure bodies 1, 2 are placed in an opposing fashion and coupled to each other, an intimate contact is accomplished between the bodies.

Then, a mask of a stripe fashion extending in the ridge direction is applied to the top portion 1a of the ridge and the lower portion 1b between the ridges of the first multilayer structure body 1. Also, the mask of the same fashion is applied to the top portion 2a of the ridge and the lower portion 2b of the second multilayer structure body 2. Then, a film of $SiO_2$ is deposited on the ridges of the first and second multilayer bodies 1, 2 to form the insulating film 16. Finally, the mask is removed and the windows 51 and 52 are formed at the top portion 1a and the lower portion 1b by the ridge of the first multilayer structure body 1 so that the p-type GaN contact layer 15 and the n-type GaN layer 11 are exposed through the windows 51 and 52. Similarly, the windows 53 and 54 are formed at the top portion 2a and the lower portion 2b of the multilayer structure body 2 so that the p-type GaAs contact layer 25 and the n-type GaAs substrate 21 are exposed through the windows 53 and 54.

The first multilayer structure body 1 is provided with a multilayer deposition including an Ni electrode layer 31, an Au intermediate layer 35a, an Au—Sn alloy layer 35. The layer 31,35a and 35 are deposited through the window 51 in the stated order on the p-type GaN contact layer 15. Further, the first multilayer structure body 1 is provided with a multilayer deposition including a Ti/Au electrode layer 32, the Au intermediate layer 35a, the Au—Sn alloy layer 35. The layer 32,35a and 35 are deposited through the window 52 in the stated order on the n-type GaN layer 11.

The second multilayer structure body 2 is provided with a multilayer deposition including an AuGe alloy layer 33 and the Au intermediate layer 35a. The layer 33 and 35 are deposited through the window 53 on the n-type GaAs substrate 21. Further, the second multilayer structure body 2 is provided with a multilayer deposition including a Cr electrode layer 34 and the Au intermediate layer 35a. The layer 34 and 35a are deposited through the window 54 on the p-type AlGaAs layer 25. The second multilayer structure body 2 undergoes anneal for 5 minutes at a temperature of 345° C. to effect alloying on the Au—Ge alloy electrode 33 and the n-type GaAs substrate 21 so as to improve the ohmic property.

The first and second multilayer structure bodies 1, 2 fabricated as described above are made opposing to each other so that the windows 51 and 52 face to the windows 53 and 54, each formed on the film surface, respectively. That is, the first and second multilayer structure bodies 1 and 2 are combined in an opposing fashion so that the top portion 1a of the ridge of the first multilayer structure body 1 faces to the lower portion 2b by the ridge of the second multilayer structure body 2 while the lower portion 1b by the ridge of the first multilayer structure body 1 faces to the top portion 2a of the ridge of the second multilayer structure body 2. Then, the combined multilayer structure bodies are pressed against each other by a jig (not shown). In this case, the first and second multilayer structure bodies 1, 2 may be provided with markers 4 and 4' in advance by etching simultaneously with the forming of the ridge. When the first and second multilayer structure bodies are made opposing to each other to combine them with pressure, registration will be preferably carried out by using the markers 4 and 4'.

Figure 10:
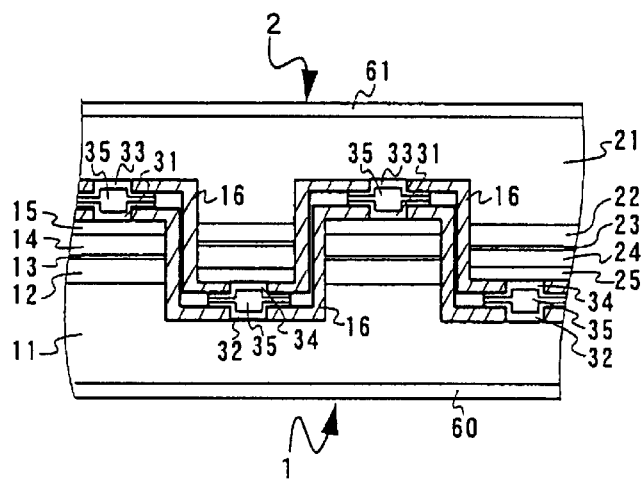
FIG. 10 is a cross-sectional view showing a structure of a laser wafer.

As shown in FIG. 10, the first and second multilayer structure bodies 1, 2 are placed in nitrogen atmosphere or nitrogen added with 5 to 10% hydrogen atmosphere to heat to an eutectic temperature of the Au—Sn alloy, 278° C. or higher while fixed and pressed together by the jig. Then, the Au intermediate layer 35a is taken into the Au—Sn alloy layer 35, whereby the first and second multilayer structure bodies 1, 2 are bonded together.

Then, the sapphire substrate 10 having no conductivity may be remove the first multilayer structure body 1 by using a lapping device. Alternatively it is desirable for the multilayer structure body to employ a sapphire substrate 10 having a specular surface as both the major surfaces, and then the sapphire substrate 10 can be is removed from the multilayer structure body by irradiating laser light with a wavelength of 200 to 300 nm from the back surface of the substrate. Although the sapphire is transparent for the laser light of the wavelength, the material of GaN tends to absorb intensively. Therefore, the GaN layer generates heat owing to the laser light absorption at the interface of GaN/sapphire, with the result that the GaN layer is decomposed into gallium and nitrogen. Since metallic gallium has a melting point of about room temperature, if the substrate is heated to about 40° C., the metallic of gallium is melted and the sapphire substrate 10 is removed.

Thereafter, the multilayer structure body is subjected to grinding at the face from which the sapphire substrate 10 has been removed. A titanium/gold (titanium/aluminum is also permissible) electrode 60 is vapor deposited.

It is desirable for the n-type GaAs substrate 21 having conductivity of the second multilayer structure body, to have a small thickness from the conductivity standpoint. However, it is necessary to take the decrease of mechanical strength into consideration.

Thus, the substrate is ground to have a thickness of about 100 μm by using a lapping device. Alumina, silicon carbide or the like is desirable for the abrasives. After being ground, the surface of the multilayer structure body is slightly etched with an acid to remove the damaged layer due to the grinding. Then, an electrode 61 made of Au—Ge alloy is evaporated onto the surface. Then, the multilayer structure body is subjected to heat treatment at a temperature of about 300° C. in order for improving the ohmic property of the electrode. The temperature for the heat treatment is such one that the first and second multilayer structure bodies 1, 2 will not suffer from deterioration in bonding.

Figure 11:
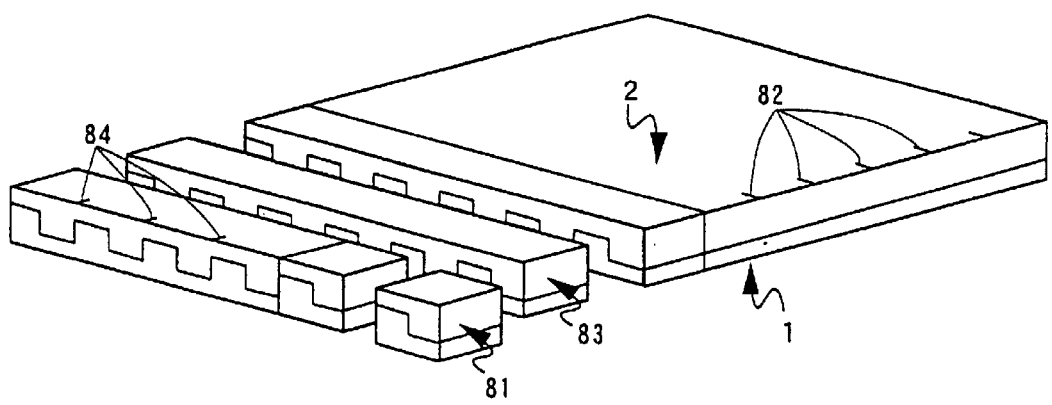
FIG. 11 is a perspective view illustrating the step of dicing the laser wafer to obtain pieces of the laser device.

As shown in FIG. 11, the obtained bonded body of the first and second multilayer structure bodies 1, 2, or the wafer of the laser devices is subjected to dicing into semiconductor laser chips 81. The side of the second multilayer structure body 2 is directed upward and provided with scribes 82 with a diamond point at an interval corresponding to the length of the laser resonator, along the edge extending in parallel with the longitudinal direction of the ridge. Then, the bonded body is broken into pieces of bar-shaped bodies 83 by taking the advantage of cleavage of the GaAs crystal and GaN crystal beginning with the scribes 83. Each bar-shaped body 83 is provided with a passivation film (serving also as reflection coat). Further, the bar-shaped body 83 is provided with scribes 84 at the interval of every chip to promote cleavage at each scribe. Thus, the chip 81 is obtained.

The thermal conductivity of the GaN and GaAs are 1.3 W/cmK and 0.46 W/cmK, respectively. Thus, when the device obtained by the above described manner is mounted on a base or the like, it is desirable to select the side of the first laser unit for the mounting side on which die bonding is carried out. In this way, it becomes possible to dissipate the heat generated from the device with ease.

According to the present invention, it becomes possible to provide, with ease and at low cost, a semiconductor laser device which is capable of selectively emitting two kinds of laser light of light emitting characteristics differing in wavelength, light emitting point, beam shape, light emission power, longitudinal mode and so on, by switching the direction of the voltage applied to the device.

What is claimed is:

1. A semiconductor laser device comprising:
   first and second laser units each having a ridge type structure and including a multilayer structure having an active layer, an n-type and p-type semiconductor layers sandwiching said active layer, therebetween, a p-side electrode and an n-side electrode, wherein the ridge portions of said first and second laser units face each other side at surfaces of said ridge portion and the p-side electrode of the first laser unit is electrically connected to the n-side electrode of the second laser unit and the n-side electrode of the first unit is electrically connected to the p-side electrode of the second laser unit.
   a first connecting layer interconnecting said p-side electrode of the first laser unit and said n-side electrode of the second laser unit; and
   a second connecting layer interconnecting between said p-side electrode of the second laser unit and said n-side electrode of the first laser unit.

2. The semiconductor laser device according to claim 1, wherein the first and second laser units are disposed in an opposing fashion with each other with an insulting layer interposed between the first and second laser units.

3. The semiconductor laser device according to claim 1, wherein at least one of said first and second connecting layers has a Schottky barrier.

4. The semiconductor laser device according to claim 2, wherein at least one of the connecting layers has a Schottky barrier.

5. The semiconductor laser device according to claim 1, wherein at least one of the first unit and the second laser unit has a Schottky barrier between the p-side electrode and the p-type semiconductor layer.

6. The semiconductor laser device according to claim 2, wherein at least one of the first laser unit and the second laser unit has a Schottky barrier between the p-side electrode and the p-type semiconductor layer.

7. The semiconductor laser device according to claim 1, wherein at least one of the first and second laser units is a semiconductor laser having a gallium nitride(GaN) system semiconductor deposited.

8. The semiconductor laser device according to claim 1, wherein at least one of the first and second laser units is a semiconductor laser having a gallium nitride (GaN) system semiconductor deposited.

9. The semiconductor laser device according to claim 3, wherein at least one of the first and second laser units is a semiconductor laser having a gallium nitride (GaN) system semiconductor deposited.

* * * * *